US006049242A

United States Patent [19]
Lutley et al.

[11] Patent Number: 6,049,242
[45] Date of Patent: *Apr. 11, 2000

[54] VOLTAGE REFERENCE SOURCE FOR AN OVERVOLTAGE-TOLERANT BUS INTERFACE

[75] Inventors: James Lutley, Portswood; Sandeep Pant, Basingstoke, both of United Kingdom

[73] Assignee: Cypress Semiconductor Corp., San Jose, Calif.

[*] Notice: This patent is subject to a terminal disclaimer.

[21] Appl. No.: 08/949,861

[22] Filed: Oct. 14, 1997

[51] Int. Cl.⁷ .............................................. H03K 19/0175
[52] U.S. Cl. ............................................. 327/333; 326/80
[58] Field of Search .................................. 326/34, 45, 62, 326/63, 68, 80–83, 86, 71; 327/319, 333, 534, 535, 537

[56] References Cited

U.S. PATENT DOCUMENTS

| | | | |
|---|---|---|---|
| 4,472,647 | 9/1984 | Allgood et al. | 307/475 |
| 4,555,642 | 11/1985 | Morales | 307/475 |
| 4,642,488 | 2/1987 | Parker | 307/475 |
| 4,698,526 | 10/1987 | Allan | 307/475 |
| 4,763,021 | 8/1988 | Stickel | 307/475 |
| 4,825,415 | 4/1989 | Nakaizumi | 365/189 |
| 4,930,112 | 5/1990 | Tanaka et al. | 365/226 |
| 4,937,700 | 6/1990 | Iwahashi | 361/91 |
| 4,964,084 | 10/1990 | Jung et al. | 365/226 |
| 5,115,150 | 5/1992 | Ludwig | 307/475 |
| 5,117,177 | 5/1992 | Eaton, Jr. | 323/314 |
| 5,144,167 | 9/1992 | McClintock | 307/475 |
| 5,247,212 | 9/1993 | Vinal | 307/448 |
| 5,268,599 | 12/1993 | Matsui | 307/475 |
| 5,300,832 | 4/1994 | Rogers | 307/475 |
| 5,329,184 | 7/1994 | Redfern | 307/475 |
| 5,359,240 | 10/1994 | Sandhu | 307/451 |
| 5,359,243 | 10/1994 | Norman | 307/475 |
| 5,381,061 | 1/1995 | Davis | 326/57 |
| 5,406,139 | 4/1995 | Sharpe-Geisler | 326/71 |
| 5,455,527 | 10/1995 | Murphy et al. | 326/83 |
| 5,455,532 | 10/1995 | Bass | 327/306 |
| 5,510,738 | 4/1996 | Gorecki et al. | 327/103 |
| 5,555,149 | 9/1996 | Wert et al. | 361/18 |
| 5,570,043 | 10/1996 | Churchill | 326/81 |
| 5,574,678 | 11/1996 | Gorecki | 364/807 |
| 5,635,860 | 6/1997 | Westerwick | 326/81 |
| 5,844,425 | 12/1998 | Nguyen et al. | 326/58 |

OTHER PUBLICATIONS

Rakesh Patel, et al., A 3.3–V Programmable Logic Device that Addresses Low Power Supply and Interface Trends, 1997, IEEE Custom Integrated Circuits Conference.

Marcel J. M. Pelgrom, et al., A ⅗ V Compatible I/O Buffer, Jul. 1995, IEEE Journal of Solid–State Circuits, vol. 30, No. 7.

Daniel W. Dobberpuhl, et al., A 200–MHz 64–b Dual–Issue CMOS Microprocessor, Nov., 1992, IEEE Journal of Solid–State Circuits, vol. 27, No. 11.

Makoto Ueda, et al., A 3.3V ASIC for Mixed Voltage Applications with Shut Down Mode, 1993, IEEE Custom Integrated Circuits Conference.

*Primary Examiner*—My-Trang Nuton
*Attorney, Agent, or Firm*—Christopher P. Maiorana, P.C.

[57] ABSTRACT

The invention relates to a voltage reference source used to control an overvoltage tolerant input/output buffer for a mixed voltage bus system. The voltage source comprises a voltage tracking circuit having a first input receiving a variable voltage, and a second input receiving a reference voltage, the voltage tracking circuit being adapted to generate an output voltage in response to the difference between the variable voltage and the reference voltage, wherein where the variable voltage is less than the reference voltage, the output voltage is held at substantially zero volts. When the variable voltage exceeds the reference voltage, the output tracks the voltage at the variable voltage input.

16 Claims, 5 Drawing Sheets

6,049,242

VOLTAGE REFERENCE SOURCE FOR AN OVERVOLTAGE-TOLERANT BUS INTERFACE

This application may relate to application Ser. No. 08/949,863, filed Oct. 14, 1997, now U.S. Pat. No. 5,914,844.

FIELD OF THE INVENTION

The present invention relates to a mixed voltage bus system and in particular, to interfaces between a number of integrated circuits and a bus where some of the integrated circuits operate at one logic level and others operate at a different logic level. In particular, the invention relates to a voltage reference source used to control overvoltage tolerant input/output buffers.

BACKGROUND TO THE INVENTION

Semiconductor integrated circuit technology is developing rapidly and one aspect of this is that modern integrated circuit devices are being designed to operate from system supply voltages which are beckoning lower. For example, many of todays integrated circuit devices operate from a 5 volt supply, whilst newer integrated circuit devices operate from a 3.3 volt supply. Some state of the art devices operate from even lower supplies of 2.5 volts or less. Accordingly, mixed voltage systems have become necessary which require "overvoltage" tolerant interfaces which allow devices which operate from a lower supply voltage to interface with other devices which operate at a higher supply voltage. As an example, FIG. 1 shows a bus 1 connected to a number of integrated circuits 2. Each device includes an i/o interface comprising an input buffer 3 and an output buffer 4 connected to the bus 1 via a pad 5. Some of the devices 2 operate from a 5 volt supply voltage whilst others operate from a lower supply voltage of 3.3 volts. Accordingly, the bus 1 has a low logic level of around 0 volts but a high logic level of between 3.3 and 5 volts, depending on which device is active. Only one of the devices 2 can drive the bus at any one time whilst the others are held in a high impedance state to ensure that they do not alter the logic level appearing on the bus 1. It is important that any device 2 which operates at the lower voltage level must be able to connect to the bus 1, even when the bus is at the higher voltage level.

FIG. 2 shows an input buffer 3 which includes a conventional bus hold circuit 6. A bus hold circuit is designed to prevent a bus from floating to an undefined state when all of the devices connected to the bus are in a high impedance state. Without this, the input buffers of devices connected to the bus could produce false transitions and may also dissipate unacceptably high currents. The bus hold circuit 6 comprises a first CMOS inverter 7 connected in a feedback path around a second CMOS inverter 8. An input to the second CMOS inverter 8 is connected to an input pad 5. The first CMOS inverter 7 includes a PMOS transistor connected in series with an NMOS transistor, the source of the PMOS transistor being connected to a 3.3 volt supply (Vcc). In use, the input pad 5 is driven by a bus and therefore the voltage which appears at the pad 5 will correspond to whatever voltage level is on the bus. The bus hold circuit 6 is designed to allow the bus to drive the input to the second inverter 8 high or low. The bus hold circuit 6 will hold the input at whatever logic level the bus was at until the pad 5 is next driven low or high by the bus so that the bus state does not become undefined. To sustain a bus hold, the first CMOS inverter 7 must be connected to the pad 5. If 5 volts is applied to a bus hold circuit operating from a 3.3 volt supply voltage (Vcc), a parasitic N-well diode (not shown) associated with the PMOS transistor of the first CMOS inverter 7 becomes forward biassed and injects current into Vcc. The N-well diode turns on when the pad voltage rises above Vcc. Furthermore, the PMOS transistor turns on as its drain voltage rises above Vcc causing an additional drain-source current to flow. In each case, the effect of the overvoltage on pad 5 is to source current from a device driving the pad into Vcc. This will lead to a low transition on the bus and may even damage the device driving the bus to 5 volts. The effect is even worse during live insertion of a device 2 onto the bus 1 since there is no voltage supply to the device when it is first connected to the bus. Accordingly, the bus hold circuit 6 shown in FIG. 2 cannot be connected to a mixed bus of the type shown in FIG. 1 because the PMOS transistor components will not function properly. If an NMOS transistor is used instead of a PMOS transistor in inverter 7 the problem of current injection into the 3.3 volt apply under overvoltage conditions could be avoided. However, an NMOS transistor connected to Vcc does produce a sufficiently high voltage level on its output due to its threshold voltage and backbody effects. An NMOS transistor could be used if its gate voltage is raised to a voltage higher than the on-chip supply Vcc by an amount which would overcome the threshold and backbody effects. However, the circuitry required to produce voltages higher than the on-chip supply tend to consume a great deal of power and are not suitable for use with a device designed for low power applications. Accordingly, use of PMOS pull-up transistors is preferred since when pulling high the drain voltage can reach the same level as the source voltage.

FIG. 3 shows a simplified example of a conventional output buffer 9 which includes a number of CMOS inverters which use PMOS transistors powered by a 3.3 volt supply (Vcc). Again, should the pad 5 be driven to a voltage above Vcc by a bus 1, the parasitic N-well diode (not shown) associated with the PMOS transistor connected to the pad 5 becomes forward biassed and so turn on, injecting current into its N-well. Also, this PMOS transistor turns on as the drain voltage rises above Vcc. In each case, the effect is to source current into the voltage supply (Vcc). Accordingly, the output buffer 9 shown in FIG. 3 cannot be connected to a mixed bus 1 of the type shown in FIG. 1 because the PMOS transistor components will not function properly.

SUMMARY OF INVENTION

According to a first aspect of the present invention, there is provided a voltage source for a semiconductor device interface, comprising a voltage tracking circuit having:
  a first input receiving a variable voltage; and,
  a second input receiving a reference voltage, the voltage tracking circuit being adapted to generate an output voltage in response to the difference between the variable voltage and the reference voltage, wherein when the variable voltage is less than the reference voltage, the output voltage is held at substantially zero volts, but when the variable voltage exceeds the reference voltage, the output tracks the voltage at the variable voltage input.

Preferably the voltage tracking circuit comprises a concatenated series of inverters, each inverter of which is coupled to the variable voltage input, wherein an output of the series of inverters provides an output of the voltage source.

According to a second aspect of the present invention there is provided an input buffer comprising:

an input driver receiving an input voltage;

a bus hold circuit coupled in parallel thereto; and, a voltage source according to the first aspect of the present invention, the voltage source decoupling the bus hold circuit from a first fixed voltage supply when the input voltage exceeds the first fixed voltage.

According to a third aspect of the present invention there is provided an output buffer comprising a pre-driver circuit and a voltage source according to the first aspect of the present invention, the voltage source decoupling the pre-driver circuit from a first fixed voltage supply when the input voltage exceeds the first fixed voltage.

BRIEF DESCRIPTION OF DRAWINGS

Examples of the present invention will now be described with reference to the accompanying drawings, in which.

DETAILED DESCRIPTION

Figure 4:
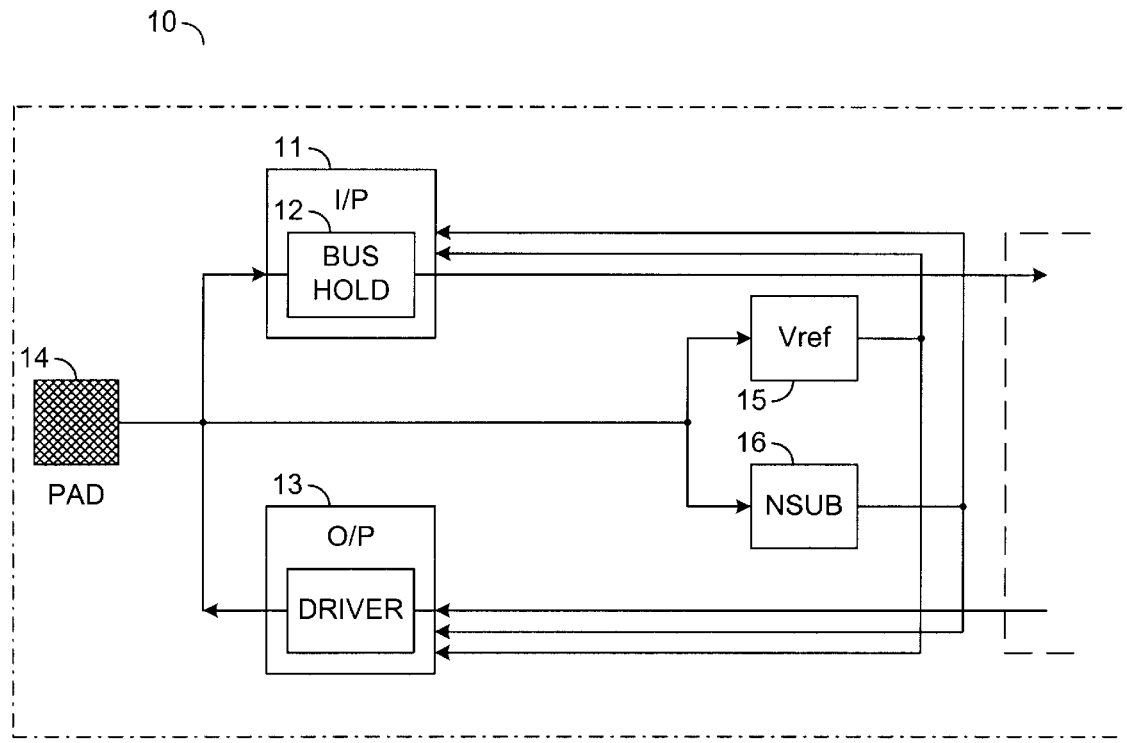
FIG. 4 is a block diagram showing an overvoltage tolerant input/output interface in accordance with the present invention.

FIG. 4 is a block diagram of an example of an overvoltage tolerant i/o interface 10 for an integrated circuit in accordance with the present invention. The i/o interface 10 comprises an input buffer 11 having a bus hold circuit 12 and an output buffer 13, each of which is connected to a common pad 14. A reference voltage generating circuit 15 and an N-well bias signal generating circuit 16 are also connected to the pad 14 and, as will be described below, control the operation of the input buffer 11 and the output buffer 13. The signals $V_{ref}$ and NSUB generated by each of these circuits, respectively, are coupled to the gates and N-wells, respectively, of a number of PMOS transistor components found within the input buffer 11 and the output buffer 13 to provide an overvoltage tolerant interface suitable for connection to a mixed voltage bus (not shown). As will be described below, each of these signals is arranged to track whatever voltage appears at the pad 14 in a predetermined manner.

Figure 1:
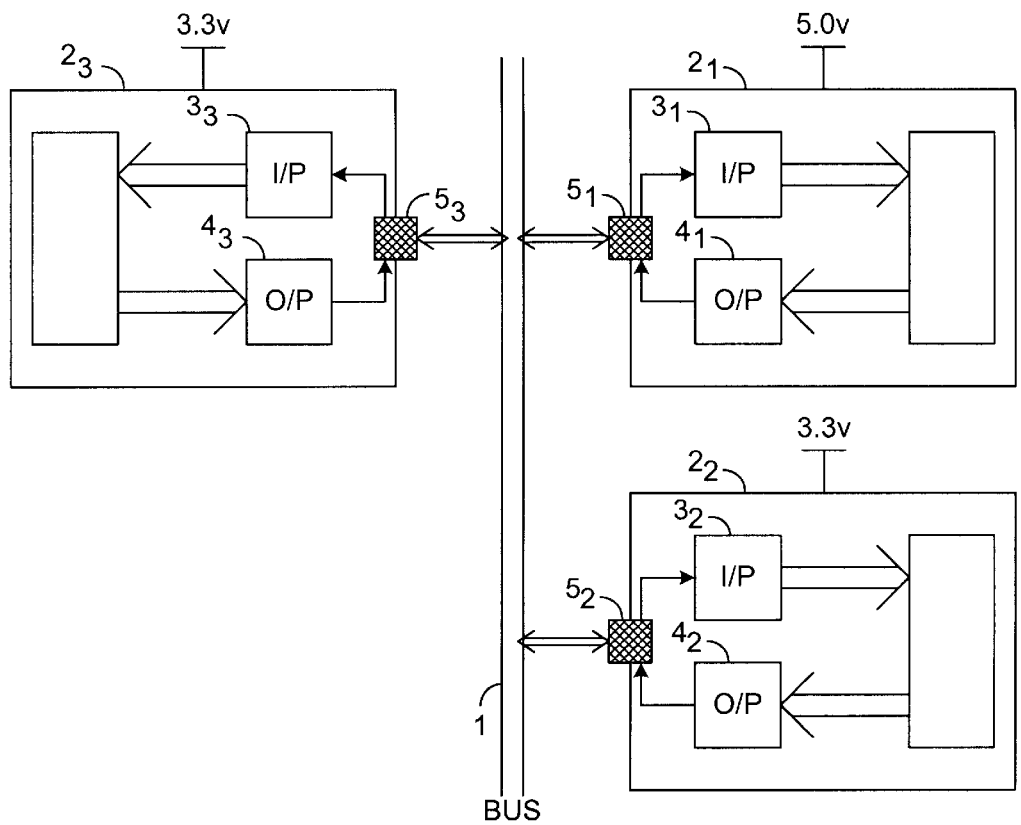
FIG. 1 shows a mixed voltage bus.
Figure 2:
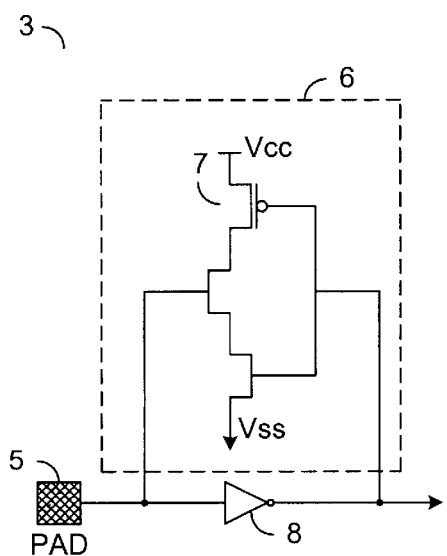
FIG. 2 shows a conventional input buffer having a bus hold circuit.
Figure 3:
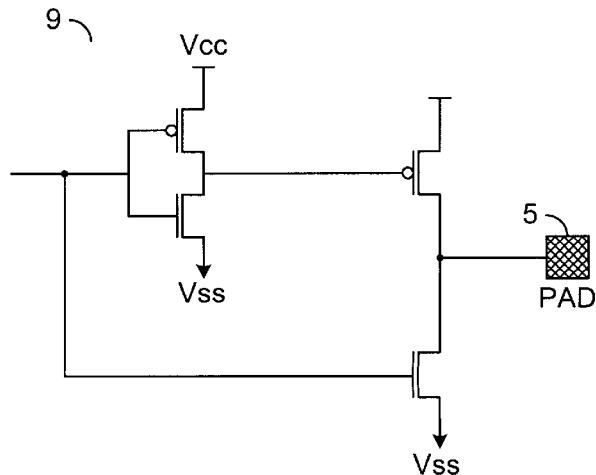
FIG. 3 shows a conventional output buffer.
Figure 5:
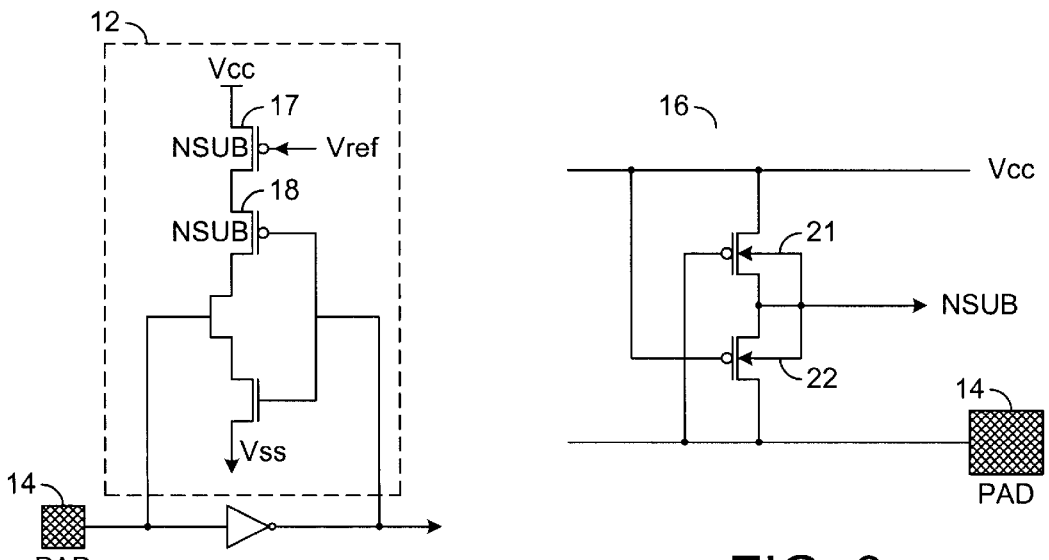
FIG. 5 shows an example of an overvoltage tolerant input buffer having a bus hold circuit in accordance with the present invention.

FIG. 5 shows an input buffer with bus hold circuit 12 in more detail. In comparison to the conventional bus hold circuit shown in FIG. 2, the bus hold circuit 12 of the present invention includes an isolation transistor 17 in the form of a first PMOS transistor coupled between the source of a second PMOS transistor 18 and the supply voltage Vcc. The gate of the isolation transistor 17 is controlled by the reference voltage signal $V_{ref}$ whilst the N-wells of each of the PMOS transistors of the bus hold circuit are controlled by the N-well bias signal NSUB. These signals are shown in FIGS. 6 and 7, respectively.

Figure 6:
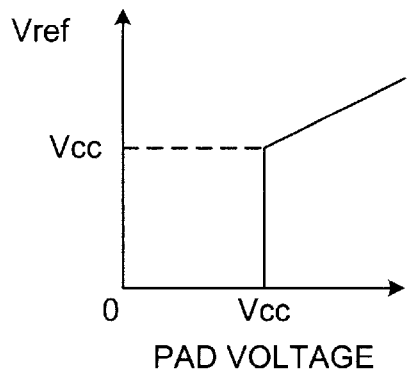
FIG. 6 shows a voltage reference signal used to control the input buffer of FIG. 5.

As shown in FIG. 6, and described in detail below, voltage reference signal $V_{ref}$ remains at zero provided the voltage at the pad 14 does not exceed Vcc. Under these conditions, the isolation transistor 17 remains on and therefore the bus hold circuit 12 functions in the conventional manner. However, if the pad voltage rises above Vcc, the voltage reference $V_{ref}$ then tracks the pad voltage to control the voltage at the gate of the isolation transistor 17. This causes the isolation transistor 17 to turn off, thereby isolating the second PMOS transistor 18 from the voltage source Vcc. Accordingly, although the drain voltage of the second PMOS transistor 18 may rise well above Vcc, the transistor 18 does not source current to Vcc.

Figure 7:
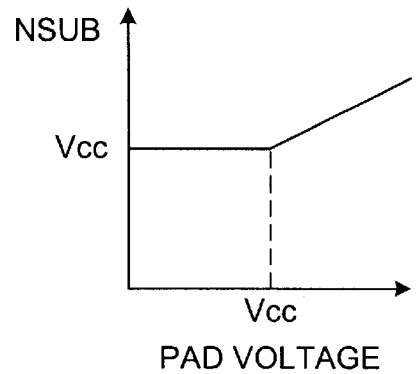
FIG. 7 shows an N-well bias signal used to control the input buffer of FIG. 5.

As shown in FIG. 7, the N-well bias signal NSUB is held constant at a level substantially equal to Vcc providing the pad voltage is below Vcc. If the pad voltage rises above Vcc, the N-well bias signal NSUB then tracks the pad voltage. This ensures that the parasitic N-well diodes in the PMOS transistor components 17 and 18 of the bus hold circuit remain reverse biassed and therefore do not source current to Vcc.

Figure 8:
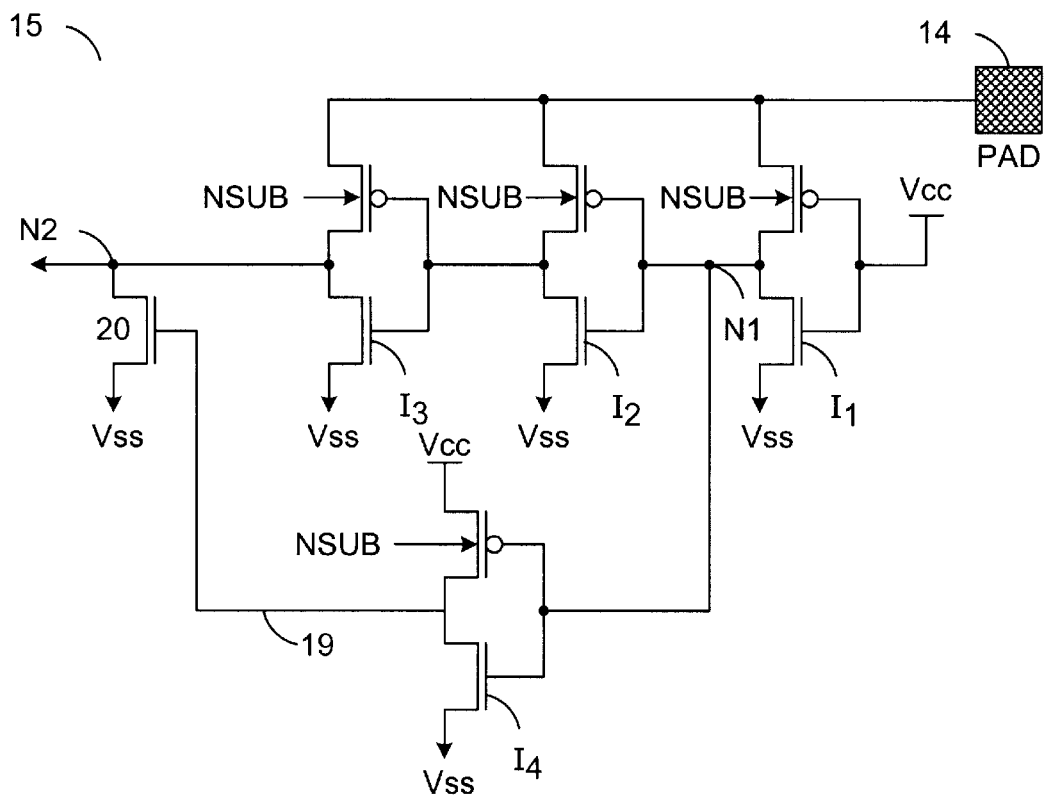
FIG. 8 shows an example of a reference voltage generating circuit in accordance with the present invention for generating the voltage reference signal shown in FIG. 6.

The voltage reference signal $V_{ref}$ is supplied by the voltage reference signal generating circuit 15 shown in detail in FIG. 8. This circuit is designed to detect when the voltage at the pad 14 exceeds Vcc and then feed the overvoltage input onto the gate of the isolation transistor 17 shown in FIG. 5. This ensures that the gate-source voltage (Vgs) is zero and so prevents the isolation transistor 17 from turning on.

The voltage reference generating circuit 15 of FIG. 8 comprises a concatenated series of inverters I1 to I3, each comprising a PMOS transistor connected in series with an NMOS transistor. The N-wells of each of the PMOS transistors are driven by the N-well bias signal (NSUB) described above to ensure that the parasitic N-well diodes remain reverse biassed and therefore do not source current to Vcc. The sources of each of the PMOS transistors of the inverters I1 to I3 are connected to the pad 14. The gates of the transistors in a first inverter I1 are tied to the voltage source Vcc. An output of the inverter I2 is fed via a further inverter I4 in a feed forward circuit path 19 to an NMOS pull-down transistor 20 at the output of the circuit.

In operation, when the pad voltage is below Vcc, the PMOS transistor in the first inverter I1 turns off and the associated NMOS transistor turns on. This gives a low output at node N1 which, once inverted by inverter I4, causes NMOS transistor 20 to turn on, pulling the output at node N2 of the circuit low. When the pad voltage rises above Vcc, the PMOS transistor in the first inverter I1 turns on so that the output at node N1 is pulled up to the voltage of the pad 14. This voltage is then passed through the following inverter stages I2 and I3 and appears at Node N2 at the output of the circuit. Accordingly, as shown in FIG. 6, when the pad voltage rises above Vcc, the voltage reference $V_{ref}$ tracks the pad voltage. The concatenated series of inverters I1 to I3 act as buffers and so improve the edge rate of the $V_{ref}$ signal. The PMOS transistor in inverter I1 is significantly larger, and hence more powerful, than the corresponding NMOS transistor. Accordingly, when the PMOS transistor turns on it is able to pull node N1 high despite the efforts of the NMOS transistor to pull this node low. The concatenation of the buffers I1 to I3 decouples the large load capacitance connected on node N2 from the output of the inverter I1.

Figure 9:
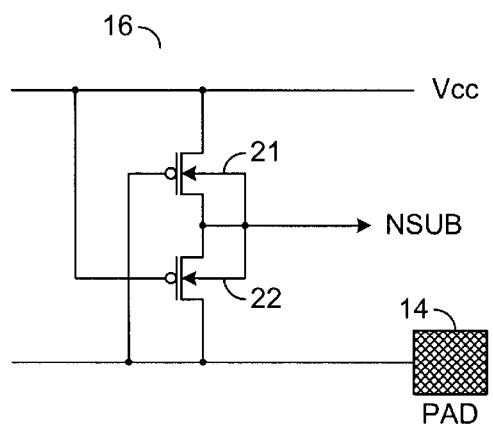
FIG. 9 shows an N-well bias signal generating circuit.

FIG. 9 shows an N-well bias signal NSUB generating circuit 16. This circuit is conventional. As shown, the circuit comprises a pair of PMOS transistors 21 and 22 connected in series between a supply rail Vcc and the pad 14. The gate of PMOS transistor 21 is connected to the pad 14 and so is controlled in dependence on whatever voltage appears at the pad 14, whilst the gate of PMOS transistor 22 is connected to Vcc. As described above with respect to FIG. 7, when the pad voltage is below Vcc, the output of the NSUB circuit 16 is held constant at a voltage level substantially equal to Vcc. Should the pad voltage rise above Vcc, the output NSUB tracks the pad voltage. The NSUB output signal is fed to a number of PMOS transistor components in the i/o interface 10 to bias the N-wells. This keeps the parasitic diodes of the N-wells reverse biassed so they do not source current to the supply voltage Vcc of the associated device.

Figure 10:
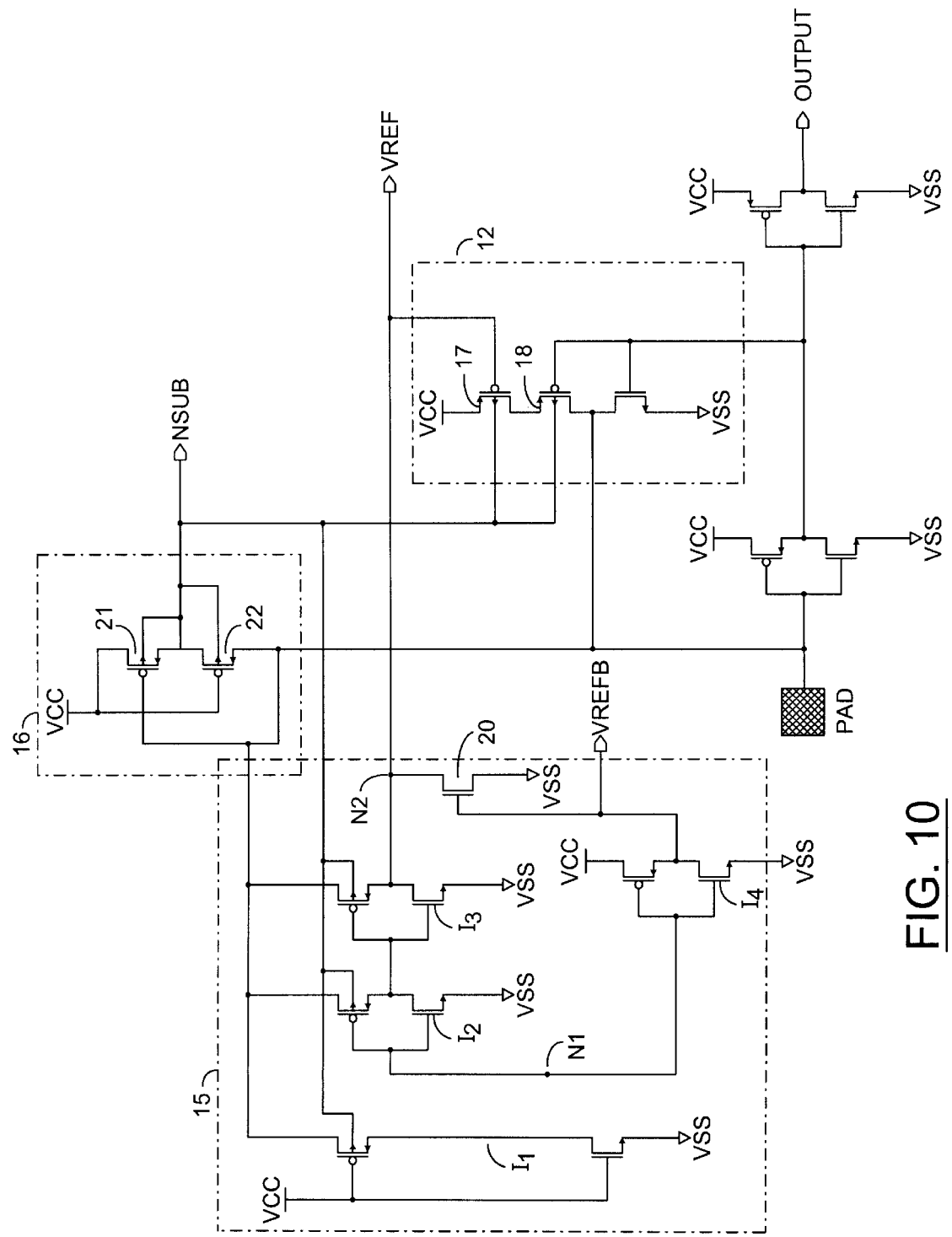
FIG. 10 shows a detailed circuit for an input buffer.

FIG. 10 is a detailed circuit for an input buffer for an integrated circuit which implements a bus hold function, showing the bus hold circuit 12, voltage reference generating circuit 15 and NSUB generating circuit 16 described above connected together. As shown, the voltage reference generating circuit also generates a signal $V_{ref}B$. Under normal conditions this signal is at a voltage level substantially equal to the supply voltage Vcc. In an overvoltage state $V_{ref}B$ corresponds to the level of Vss.

Figure 11:
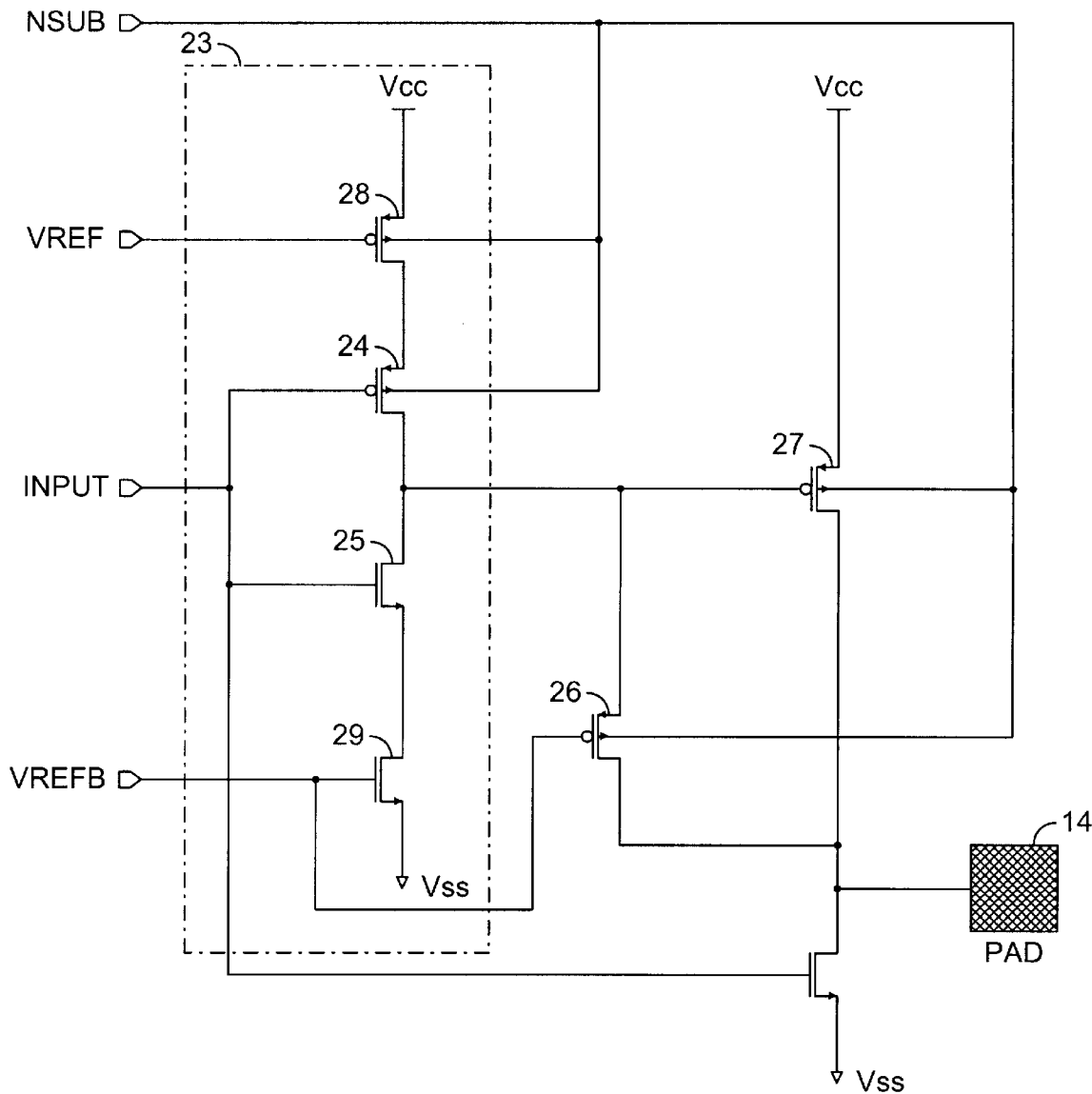
FIG. 11 shows an example of an overvoltage tolerant output buffer in accordance with the present invention.

FIG. 11 shows an example of an overvoltage tolerant output buffer in accordance with the present invention. The voltage reference generating circuit and N-well bias signal generating circuit have been omitted for clarity. The N-wells of the PMOS transistor components in the circuit are connected to the N-well bias signal NSUB. The output buffer includes a pre-driver circuit 23, a PMOS transistor 24 and an NMOS transistor 25. The voltage reference signal $V_{ref}B$ is connected to the gate of a PMOS transistor 26. The source of the transistor 26 is connected to the gate of an output PMOS transistor 27 and the drain is connected to the pad 14. Under overvoltage conditions, transistor 26 turns on and so raises the gate voltage of transistor 26 to that of the pad 14. Two isolation transistors 28 and 29 are provided in the pre-driver 23. PMOS isolation transistor 28 prevents current injection into Vcc because its gate is connected to $V_{ref}$, whilst NMOS isolation transistor 29 prevents leakage into Vss because its crate is coupled to $V_{ref}B$ which ensures that the transistor 29 remains switched off.

The i/o buffers described above are overvoltage tolerant and can therefore be connected to a mixed voltage bus whilst retaining their functionality and without affecting the performance of the bus.

We claim:

1. A circuit, comprising
   a first input receiving a variable voltage; and
   a second input receiving a reference voltage,
   a voltage tracking circuit generating an output voltage in response to a difference between the variable voltage and the reference voltage, wherein when the variable voltage is less than the reference voltage, the output voltage is substantially zero volts, but when the variable voltage exceeds the reference voltage, the output voltage is substantially the same as the variable voltage.

2. A circuit according to claim 1, further comprising an on-chip fixed voltage supply to which the reference voltage input is connected.

3. A circuit according to claim 1, comprising an inverter having a pull-up transistor and a pull-down transistor connected in series, wherein the gates of the pull-up transistor and the pull-down transistor are connected to the reference voltage input, and the source connection of the pull-up transistor is coupled to the variable voltage input.

4. A circuit according to claim 3, in which an output of the inverter is coupled to a transistor configured to hold the output voltage at substantially zero volts when the variable voltage is below the reference voltage.

5. A circuit according to claim 4, in which the wells of at least one of the pull-up transistors in the series of inverters is reverse biassed.

6. A circuit according to claim 1, in which the voltage tracking circuit comprises a concatenated series of inverters, each inverter of which is coupled to the variable voltage input, wherein an output of the series of inverters provides an output of the voltage source.

7. A circuit according to claim 6, in which each inverter comprises a pull-up transistor and an associated pull-down transistor connected in series, wherein the pull-up transistor in at least one inverter is larger than the associated pull-down transistor.

8. A circuit according to claim 7, in which the drain connection of the pull-down transistor of at least one inverter is coupled to a second on-chip fixed voltage supply.

9. A circuit according to claim 1, further comprising a pad connected to the variable voltage input.

10. An input buffer comprising:
    an input driver receiving an input voltage;
    a bus hold circuit coupled in parallel thereto; and
    the circuit according to claim 1, the circuit decoupling the bus hold circuit from a first fixed voltage supply when the input voltage exceeds the first fixed voltage.

11. An input buffer according to claim 10, in which the bus hold circuit comprises a PMOS transistor having a gate receiving the output voltage.

12. A bus system comprising:
    at least first and second independent operating voltages,
    a bus, and
    a number of semiconductor devices coupled to said bus, wherein at least one of said semiconductor devices includes the input buffer according to claim 10.

13. The bus system according to claim 12, further comprising an output buffer and a pre-driver circuit, wherein the pre-driver circuit comprises a PMOS transistor receiving the output voltage and is decoupled from the first fixed voltage supply when the variable voltage exceeds the first fixed voltage.

14. An output buffer comprising a pre-driver circuit and the circuit according to claim 1, the circuit decoupling the pre-driver circuit from a first fixed voltage supply when the input voltage exceeds the first fixed voltage.

15. An output buffer according to claim 14, in which the pre-driver circuit comprises a PMOS transistor having a gate receiving the output voltage.

16. A bus system comprising:
    at least first and second independent operating voltages,
    a bus, and
    a number of semiconductor devices coupled to said bus, wherein at least one of said semiconductor devices includes the output buffer according to claim 14.

* * * * *